US010827049B2

(12) United States Patent
Kang et al.

(10) Patent No.: US 10,827,049 B2
(45) Date of Patent: *Nov. 3, 2020

(54) MOBILE TERMINAL

(71) Applicant: LG Electronics Inc., Seoul (KR)

(72) Inventors: Jaehyuk Kang, Seoul (KR); Jinho Jang, Seoul (KR); Hyunseok Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/718,621

(22) Filed: Dec. 18, 2019

(65) Prior Publication Data
US 2020/0128115 A1 Apr. 23, 2020

Related U.S. Application Data

(63) Continuation of application No. 16/260,800, filed on Jan. 29, 2019, now Pat. No. 10,567,561, which is a
(Continued)

(30) Foreign Application Priority Data

Oct. 17, 2013 (KR) .................. 10-2013-0124166

(51) Int. Cl.
H04M 1/00 (2006.01)
H01Q 1/24 (2006.01)
(Continued)

(52) U.S. Cl.
CPC .......... H04M 1/026 (2013.01); G06F 1/1626 (2013.01); G06F 1/1637 (2013.01);
(Continued)

(58) Field of Classification Search
CPC ...... H01M 1/02; H01M 1/026; H01M 1/0202; H01M 1/0249; H01M 1/03; H01M 1/18;
(Continued)

(56) References Cited

U.S. PATENT DOCUMENTS 6,532,152 B1 3/2003 White et al.
6,785,566 B1 8/2004 Irizarry
(Continued)

FOREIGN PATENT DOCUMENTS

CN 101207230 A 6/2008
EP 2 552 086 A2 1/2013
(Continued)

Primary Examiner — Quochien B Vuong
(74) Attorney, Agent, or Firm — Birch, Stewart, Kolasch & Birch, LLP

(57) ABSTRACT

A bar-type mobile terminal can include a wireless communication unit including one or more components which permit wireless communications between the bar type mobile terminal and a wireless communication system; a plurality of antennas configured to transmit or receive radio signals; a metallic frame having a front side and a rear side, the metallic frame including a base portion, an edge portion forming an appearance of the bar-type mobile terminal, an upper through hole disposed in an upper portion of the metallic frame, and a lower through hole disposed in a lower portion of the metallic frame; an upper non-metallic coupling disposed in the upper through hole of the metallic frame; a lower non-metallic coupling disposed in the lower through hole of the metallic frame; a window disposed on the front side of the metallic frame; a display module disposed between the window and the front side of the metallic frame; a first waterproof layer disposed between the window and a front side of the edge portion of the metallic frame; a cover disposed on the rear side of the metallic frame; a first printed circuit board (PCB) disposed between the cover and the rear side of the metallic frame, in which
(Continued)

the wireless communication unit is mounted on the first PCB; and a second waterproof layer disposed between the cover and a rear side of the edge portion of the metallic frame.

23 Claims, 10 Drawing Sheets

Related U.S. Application Data continuation of application No. 16/046,661, filed on Jul. 26, 2018, now Pat. No. 10,230,415, which is a continuation of application No. 15/632,012, filed on Jun. 23, 2017, now Pat. No. 10,097,227, which is a continuation of application No. 14/464,167, filed on Aug. 20, 2014, now Pat. No. 9,720,458.

(51) Int. Cl.

| | | |
|---|---|---|
| *H04M 1/02* | (2006.01) | |
| *G06F 1/18* | (2006.01) | |
| *G06F 1/16* | (2006.01) | |
| *G06F 1/20* | (2006.01) | |
| *H01Q 1/44* | (2006.01) | |
| *H04B 1/3827* | (2015.01) | |
| *H04M 1/18* | (2006.01) | |
| *H05K 5/00* | (2006.01) | |
| *H05K 5/02* | (2006.01) | |
| *H05K 5/03* | (2006.01) | |
| *H05K 5/04* | (2006.01) | |
| *H05K 5/06* | (2006.01) | |
| *H05K 7/20* | (2006.01) | |
| *H04B 1/38* | (2015.01) | |

(52) U.S. Cl.
CPC .......... *G06F 1/1656* (2013.01); *G06F 1/1658* (2013.01); *G06F 1/182* (2013.01); *G06F 1/203* (2013.01); *H01Q 1/243* (2013.01); *H01Q 1/44* (2013.01); *H04B 1/3833* (2013.01); *H04M 1/0249* (2013.01); *H04M 1/0262* (2013.01); *H04M 1/0266* (2013.01); *H04M 1/0277* (2013.01); *H04M 1/18* (2013.01); *H05K 5/0008* (2013.01); *H05K 5/0239* (2013.01); *H05K 5/03* (2013.01); *H05K 5/04* (2013.01); *H05K 5/069* (2013.01); *H05K 7/20436* (2013.01); *H04B 2001/3894* (2013.01); *H04M 2001/0204* (2013.01)

(58) Field of Classification Search
CPC ...... H04B 1/38; H04B 1/3833; H04B 1/3888; H04B 2001/3894; G06F 1/201; G06F 1/1626; G06F 1/1656
See application file for complete search history.

(56) References Cited

U.S. PATENT DOCUMENTS

| | | | |
|---|---|---|---|
| 6,844,845 | B1 | 1/2005 | Whiteside et al. |
| 7,336,489 | B1 | 2/2008 | Chen et al. |
| 7,471,965 | B2 | 12/2008 | Jeon |
| 7,558,594 | B2 | 7/2009 | Wilson |
| 7,941,196 | B2 | 5/2011 | Kawasaki et al. |
| 8,301,213 | B2 | 10/2012 | Murata et al. |
| 8,406,008 | B2 * | 3/2013 | Han ...................... H04M 1/026 361/728 |
| 8,442,593 | B1 | 5/2013 | Kwon et al. |
| 8,838,190 | B2 | 9/2014 | Komiyama et al. |
| 9,131,608 | B2 | 9/2015 | Oi |
| 9,203,456 | B2 * | 12/2015 | Teng ...................... H04B 1/38 |
| 9,462,098 | B2 | 10/2016 | Chang |
| 9,538,681 | B2 * | 1/2017 | Kim ...................... H04M 1/0266 |
| 9,735,827 | B2 | 8/2017 | Richardson et al. |
| 10,153,799 | B2 | 12/2018 | Hwang et al. |
| 2005/0136967 | A1 | 6/2005 | Jeon |
| 2006/0003709 | A1 | 1/2006 | Wood |
| 2006/0176226 | A1 | 8/2006 | Moon et al. |
| 2008/0150815 | A1 | 6/2008 | Nakahata et al. |
| 2011/0286173 | A1 | 11/2011 | Moore et al. |
| 2012/0028691 | A1 | 2/2012 | Koehl |
| 2012/0044635 | A1 | 2/2012 | Rothkopf et al. |
| 2012/0178382 | A1 | 7/2012 | Merz et al. |
| 2012/0257341 | A1 | 10/2012 | Wang et al. |
| 2013/0050953 | A1 | 2/2013 | Sano et al. |
| 2013/0217451 | A1 | 8/2013 | Komiyama et al. |
| 2013/0250504 | A1 | 9/2013 | Choi |

FOREIGN PATENT DOCUMENTS

| | | |
|---|---|---|
| EP | 2 565 742 A2 | 3/2013 |
| JP | 2010-232750 A | 10/2010 |
| JP | 2010-536246 A | 11/2010 |
| JP | 2012-75154 A | 4/2012 |
| JP | 2012-186811 A | 9/2012 |
| JP | 2012-199687 A | 10/2012 |
| JP | 2012-222701 A | 11/2012 |
| JP | 2012-239151 A | 12/2012 |
| JP | 2013-55660 A | 3/2013 |
| JP | 2013-110464 A | 6/2013 |
| KR | 10-2012-0117048 A | 10/2012 |
| KR | 10-2012-0134227 A | 12/2012 |
| KR | 10-2013-0012521 A | 2/2013 |
| WO | WO 01/41522 A1 | 6/2001 |
| WO | WO 2012/096891 A2 | 7/2012 |
| WO | WO 2012/161099 A1 | 11/2012 |

* cited by examiner

MOBILE TERMINAL

CROSS-REFERENCE TO RELATED APPLICATIONS

This application is a Continuation of U.S. application Ser. No. 16/260,800 filed on Jan. 29, 2019, which is a Continuation of U.S. patent application Ser. No. 16/046,661 filed on Jul. 26, 2018 (now U.S. Pat. No. 10,230,415 issued on Mar. 12, 2019), which is a Continuation of U.S. patent application Ser. No. 15/632,012 filed on Jun. 23, 2017 (now U.S. Pat. No. 10,097,227 issued on Oct. 9, 2018), which is a Continuation of U.S. patent application Ser. No. 14/464,167 filed on Aug. 20, 2014 (now U.S. Pat. No. 9,720,458 issued on Aug. 1, 2017), which claims priority benefit under 35 U.S.C. § 119(a) to Korean Application No. 10-2013-0124166 filed on Oct. 17, 2013, all of which are hereby expressly incorporated by reference into the present application.

BACKGROUND OF THE INVENTION

As a mobile terminal becomes multifunctional, the mobile terminal can be allowed to capture still images or moving images, play music or video files, play games, receive broadcasts, etc., so as to be implemented as an integrated multimedia player.

Terminals can be divided into mobile/portable terminals and stationary terminals according to their mobility. The mobile terminal is a portable device that can be carried anywhere and have one or more of a function of performing voice and video calls, a function of inputting/outputting information, a function of storing data, etc.

In order to support and enhance such functions of the terminal, it can be considered to improve the configuration and/or software of the terminal.

In recent years, the mobile terminal is configured to provide Long Term Evolution (LTE) service and is implemented as a smart phone. However, such mobile terminal has a degraded performance due to heat generated from inside thereof, which causes a user's inconvenience. Especially, in case of a smart phone which requires processing of data which corresponds to 100 Mbps, and which requires a function close to a personal computer (PC), the mobile terminal operates in a clock more than 1 GHz. This may cause heat generation from the mobile terminal.

Further, demand for a mobile terminal capable of operating in a more severe environment for prevention of malfunction when it is immersed in water, is increased.

Accordingly, a new type of mobile terminal capable of having a sealed inner structure for waterproofing and capable of radiating heat generated by various types of inner components, may be considered.

SUMMARY OF THE INVENTION

Therefore, an aspect of the detailed description is to provide a mobile terminal having a radiating structure and a waterproofing structure differentiated from the conventional art.

Another aspect of the detailed description is to provide a mobile terminal having a more enhanced structure and composite functions.

To achieve these and other advantages and in accordance with the purpose of this specification, as embodied and broadly described herein, there is provided a mobile terminal, comprising: a display unit; a metallic frame having a front surface and a rear surface, comprising: a base portion thermally coupled to the display unit, and an edge portion continuous with and adjacent to an outer periphery of the base portion; a first cover and a second cover coupled to the front and rear surfaces of the metallic frame, respectively; a first waterproof layer and a second waterproof layer arranged between the first cover and the metallic frame, and between the second cover and the metallic frame, respectively, wherein the edge portion is configured to radiate heat generated by the display unit from a space inside the mobile terminal, between the first cover and the second cover, to a space outside of the mobile terminal, wherein the base portion is thermally coupled to the display unit by arranging a thermal member between, and in contact with, the display unit and the metallic frame, by direct contact of the display unit with the metallic frame, or by non-contact proximity of the display unit to the metallic frame.

According to an embodiment of the present invention, the display unit may include: a display unit configured to display image information; and a window coupled to the display unit so as to cover one surface of the display unit. The first cover may be provided with a window mounting portion configured to mount the window thereto.

According to an embodiment of the present invention, the mobile terminal may further include a third waterproof layer arranged between the window mounting portion and the window.

According to an embodiment of the present invention, the mobile terminal may further include a non-metallic coupling formed as a single structure at the front and rear surfaces of the metallic frame.

According to an embodiment of the present invention, wherein the non-metallic coupling and the metallic frame comprise an integral unit, and the non-metallic coupling may be integrally formed with the metallic frame and the non-metallic coupling may be formed by plastic overmold through and about the metallic frame and the non-metallic coupling may be formed between the edge portion and the base portion on both sides of the metallic frame.

According to an embodiment of the present invention, wherein the metallic frame may be provided with a hole penetrating between the front surface and the rear surface and a portion of the non-metallic coupling passes through the hole and joins the non-metallic coupling on the front surface with the non-metallic coupling on the rear surface, wherein the non-metallic coupling and the metallic frame comprise an integral unit.

According to an embodiment of the present invention, the non-metallic coupling may be formed by plastic overmold through and about the metallic frame.

According to an embodiment of the present invention, each of the first and second waterproof layers may be arranged between the non-metallic coupling and the first and second covers, respectively.

According to an embodiment of the present invention, the first waterproof layer may be disposed to fill a gap between the first cover and the metallic frame, and wherein the first waterproof layer may be implemented as a waterproof member having opposing surfaces that are attached to the first cover and the metallic frame, respectively.

According to an embodiment of the present invention, the second waterproof layer may include: a first member coupled to a groove portion of the second cover; and a second member protruding from the first member, and transformed toward an interior of the mobile terminal when the second cover is coupled to the metallic frame.

According to an embodiment of the present invention, the non-metallic coupling may be provided with a socket mounting portion for mounting a socket thereto, the socket to which an external device is electrically-connected, and wherein a second through portion for passing a third flexible printed circuit board therethrough may be formed at a partition wall which defines the socket mounting portion.

According to an embodiment of the present invention, when the second cover may be coupled to the metallic frame, the second member may be adhered to the partition wall.

According to an embodiment of the present invention, the edge portion may a plurality of radiation portions configured to radiate wireless signals at different frequency bands.

According to an embodiment of the present invention, patterns may be formed on one surface of the second cover, so as to form a radiator together with the radiation portions.

According to an embodiment of the present invention, the radiation portion and the pattern may be connected to each other by a coupling portion penetratingly-formed at the second cover, and may operate as a radiator of an antenna.

According to an embodiment of the present invention, the mobile terminal may further include: a through hole configured to insert the coupling portion thereinto; and a conductive connection portion which extends from an inner circumference of the through hole to the radiation portion.

According to an embodiment of the present invention, the mobile terminal may further include a main printed circuit board disposed on a rear surface of the metallic frame, and configured to transmit heat to the metallic frame. The metallic frame may be provided with a rib protruding from a rear surface of the metallic frame, so as to divide a first region where the main printed circuit board may be mounted from a second region where a battery is mounted.

According to an embodiment of the present invention, the mobile terminal may further include a sub printed circuit board disposed at a third region divided from the second region by the rib. The metallic frame may be provided with a first through portion for passing a first flexible printed circuit board therethrough, the first flexible printed circuit board configured to connect the display unit and the sub printed circuit board with each other.

According to an embodiment of the present invention, the mobile terminal may further include a second flexible printed circuit board configured to connect the main printed circuit board and the sub printed circuit board with each other. The second flexible printed circuit board may cover the battery partially, and extend from the main printed circuit board to the sub printed circuit board.

According to an embodiment of the present invention, the second cover may be provided with an opening positioned to expose the battery. The second cover may be provided with a first concaved portion recessed from one surface of the second cover along an outer periphery of the opening. And a fourth waterproof layer may be arranged at the first concaved portion.

According to an embodiment of the present invention, the mobile terminal may further include a third cover coupled to the second cover or the metallic frame, so as to cover the second cover and the battery. The third cover may be provided with a second concaved portion recessed from one surface thereof in correspondence to the first concaved portion.

The mobile terminal according to the present invention can have the following advantages.

Firstly, temperature increase inside the mobile terminal due to heat generation from an electronic device can be restricted.

Secondly, the mobile terminal can have a waterproof function.

Further scope of applicability of the present application will become more to apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated. Hereinafter, a mobile terminal of the present disclosure will be explained in more detail with reference to the attached drawings. The suffixes "module", "unit" and "portion" for components used in the following description are provided only for facilitation of preparing this specification, and thus they are not granted a specific meaning or function. In addition, when it is determined that a detailed description of a technology known in the related art would not add value to an explanation of the nature and gist of the present invention, the detailed description of the technology is omitted. In addition, the accompanying drawings are only for helping get an easy understanding of the idea of the present invention and notably, should not be construed as imposing any limitation on the idea of the invention.

The mobile terminal according to the present invention may include a portable phone, a smart phone, a laptop computer, a digital broadcasting terminal, Personal Digital Assistants (PDA), Portable Multimedia Player (PMP), a navigation system, etc. However, it will be obvious to those skilled in the art that the present invention may also be applicable to a fixed terminal such as a digital TV and a desktop computer.

Figure 1:
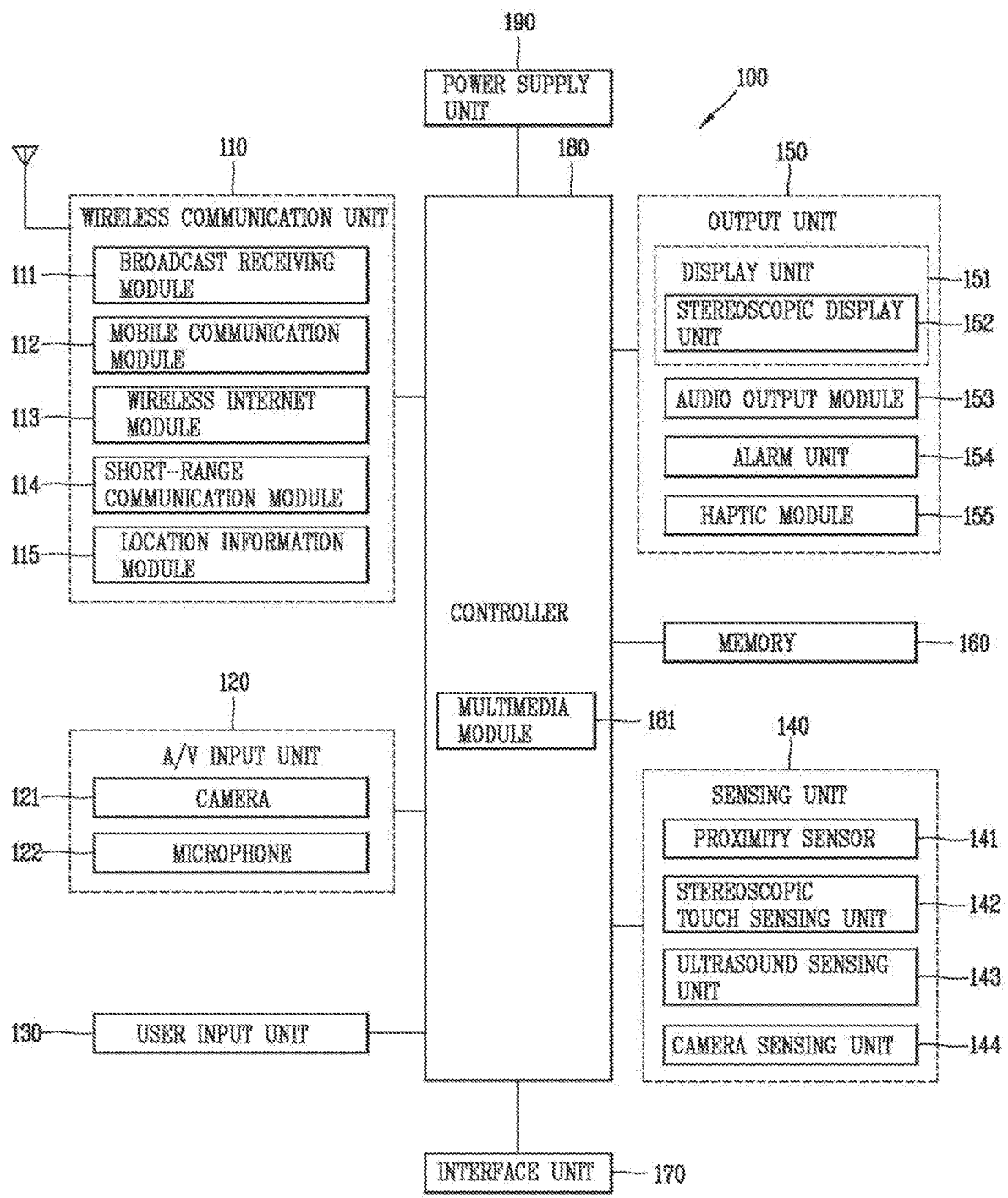
FIG. 1 is a block diagram of a mobile terminal according to an embodiment of the present invention.

FIG. 1 is a block diagram of a mobile terminal according to an embodiment of the present invention.

The mobile terminal 100 may comprise components, such as a wireless communication unit 110, an Audio/Video (A/V) input unit 120, a user input unit 130, a sensing unit 140, an output unit 150, a memory 160, an interface unit 170, a controller 180, a power supply unit 190, and the like. FIG. 1 shows the mobile terminal 100 having various components, but it is understood that implementing all of the illustrated components is not a requirement. A greater or fewer number of components may alternatively be implemented.

Hereinafter, each component is described in sequence.

The wireless communication unit 110 may typically include one or more components which permit wireless communications between the mobile terminal 100 and a wireless communication system or between the mobile terminal 100 and a network within which the mobile terminal 100 is located. For example, the wireless communication unit 110 may include a broadcast receiving module 111, a mobile communication module 112, a wireless Internet module 113, a short-range communication module 114, a position information module 115, and the like.

The broadcast receiving module 111 may receive broadcast signals and/or broadcast associated information from an external broadcast management server (or other network entity) via a broadcast channel.

The broadcast channel may include a satellite channel and/or a terrestrial channel. The broadcast management server may be a server that generates and transmits a broadcast signal and/or broadcast associated information or a server that receives a previously generated broadcast signal and/or broadcast associated information and transmits the same to a terminal. The broadcast associated information may refer to information associated with a broadcast channel, a broadcast program or a broadcast service provider. The broadcast signal may include a TV broadcast signal, a radio broadcast signal, a data broadcast signal, and the like. Also, the broadcast signal may further include a broadcast signal combined with a TV or radio broadcast signal.

The broadcast associated information may also be provided via a mobile communication network and, in this case, the broadcast associated information may be received by the mobile communication module 112.

The broadcast signal may exist in various forms. For example, it may exist in the form of an electronic program guide (EPG) of digital multimedia broadcasting (DMB), electronic service guide (ESG) of digital video broadcast-handheld (DVB-H), and the like.

The broadcast receiving module 111 may be configured to receive signals broadcast by using various types of broadcast systems. In particular, the broadcast receiving module 111 may receive a digital broadcast by using a digital broadcast system such as multimedia broadcasting-terrestrial (DMB-T), digital multimedia broadcasting-satellite (DMB-S), digital video broadcast-handheld (DVB-H), the data broadcasting system known as media forward link only (MediaFLO)®, integrated services digital broadcast-terrestrial (ISDB-T), etc. The broadcast receiving module 111 may be configured to be suitable for every broadcast system that provides a broadcast signal as well as the above-mentioned digital broadcast systems.

Broadcasting signals and/or broadcasting associated information received through the broadcast receiving module 111 may be stored in the memory 160.

The mobile communication module 112 transmits/receives wireless signals to/from at least one of network entities (e.g., base station, an external terminal, a server, etc.) on a mobile communication network. Here, the wireless signals may include audio call signal, video call signal, or various formats of data according to transmission/reception of text/multimedia messages.

The mobile communication module 112 is configured to implement a video call mode and a voice call mode. The video call mode indicates a call performed while a user views counterpart, whereas the voice call mode indicates a call performed while a user does not view counterpart. For implementation of the video call mode and the voice call mode, the mobile communication module 112 is configured to transmit and receive at least one of voice data and image data.

The wireless internet module 113 supports wireless Internet access for the mobile terminal. This module may be internally or externally coupled to the mobile terminal 100. Examples of such wireless Internet access may include Wireless LAN (WLAN), Wi-Fi, Wireless Broadband (WI-BRO)®, World Interoperability for Microwave Access (WI-MAX)®, High Speed Downlink Packet Access (HSDPA), and the like.

The short-range communication module 114 denotes a module for short-range communications. Suitable technologies for implementing this module may include BLUETOOTH®, Radio Frequency IDentification (RFID), Infrared Data Association (IrDA)®, Ultra-WideBand (UWB), ZigBee®, and the like.

The position information module 115 denotes a module for sensing or calculating a position of a mobile terminal. An example of the position information module 115 may include a Global Position System (GPS) module.

Referring to FIG. 1, the A/V input unit 120 is configured to receive an audio or video signal. The A/V input unit 120 may include a camera 121, a microphone 122 or the like. The camera 121 processes image frames such as still images or moving images acquired by an image sensor in a video call mode or an image capturing mode. The processed image frames may be displayed on a display unit 151.

The image frames processed by the camera 121 may be stored in the memory 160 or transmitted to the outside via the wireless communication unit 110. Two or more cameras 121 may be provided according to the configuration of the mobile terminal.

The microphone 122 may receive sounds (audible data) via a microphone in a phone call mode, a recording mode, a voice recognition mode, and the like, and can process such sounds into audio data. The processed audio (voice) data may be converted for output into a format transmittable to a mobile communication base station via the mobile communication module 112 in case of the phone call mode. The microphone 122 may implement various types of noise canceling (or suppression) algorithms to cancel (or suppress) noise or interference generated while receiving and transmitting audio signals.

The user input unit 130 may generate input data for allowing a user to control various operations of the mobile communication terminal. The user input unit 130 may include a keypad, a dome switch, a touch pad (e.g., a touch sensitive member that detects changes in resistance, pressure, capacitance, etc. due to being contacted) a jog wheel, a jog switch, and the like.

The sensing unit 140 detects a current status (or state) of the mobile terminal 100 such as an opened or closed state of the mobile terminal 100, a location of the mobile terminal 100, the presence or absence of user contact with the mobile terminal 100 (e.g., touch inputs), the orientation of the mobile terminal 100, an acceleration or deceleration movement and direction of the mobile terminal 100, etc., and generates commands or signals for controlling the operation of the mobile terminal 100. For example, when the mobile terminal 100 is implemented as a slide type mobile phone, the sensing unit 140 may sense whether the slide phone is open or closed. In addition, the sensing unit 140 can detect whether or not the power supply unit 190 supplies power or whether or not the interface unit 170 is coupled with an external device.

The output unit 150 is configured to provide outputs in a visual, audible, and/or tactile manner. The output unit 150 may include the display unit 151, an audio output module 153, an alarm unit 154, a haptic module 155, and the like.

The display unit 151 may display information processed in the mobile terminal 100. For example, when the mobile terminal 100 is in a phone call mode, the display unit 151 may display a User Interface (UI) or a Graphic User Interface (GUI) associated with a call. When the mobile terminal 100 is in a video call mode or image capturing mode, the display unit 151 may display a captured image and/or received image, or a UI or GUI.

The display unit 151 may include at least one of a Liquid Crystal Display (LCD), a Thin Film Transistor-LCD (TFT-LCD), an Organic Light Emitting Diode (OLED) display, a flexible display, a three-dimensional (3D) display, and an e-ink display.

Some of these displays may be configured to be transparent so that outside may be seen therethrough, which may be referred to as a transparent display. A representative example of the transparent display may include a Transparent Organic Light Emitting Diode (TOLED), and the like. The rear surface portion of the display unit 151 may also be implemented to be optically transparent. Under this configuration, a user can view an object positioned at a rear side of a body through a region occupied by the display unit 151 of the body.

The display unit 151 may be implemented in two or more in number according to a configured aspect of the mobile terminal 100. For instance, a plurality of displays may be arranged on one surface integrally or separately, or may be arranged on different surfaces.

The display unit 151 may also be implemented as a stereoscopic display unit 152 for displaying stereoscopic images.

Here, the stereoscopic image may be a three-dimensional (3D) stereoscopic image, and the 3D stereoscopic image may be an image making a viewer feel that a gradual depth and reality of an object on a monitor or a screen is the same as a reality space. A 3D stereoscopic image may be implemented by using binocular disparity. Binocular disparity refers to disparity made by the positions of two eyes. When two eyes view different 2D images, the images are transferred to the brain through the retina and combined in the brain to provide the perception of depth and reality sense.

The stereoscopic display unit 152 may employ a stereoscopic display scheme such as stereoscopic scheme (a glass scheme), an auto-stereoscopic scheme (glassless scheme), a projection scheme (holographic scheme), or the like. Stereoscopic schemes commonly used for home television receivers, or the like, include Wheatstone stereoscopic scheme, or the like.

The auto-stereoscopic scheme includes, for example, a parallax barrier scheme, a lenticular scheme, an integral imaging scheme, or the like. The projection scheme includes a reflective holographic scheme, a transmissive holographic scheme, or the like.

In general, a 3D stereoscopic image is comprised of a left image (a left eye image) and a right image (a right eye image). According to how left and right images are combined into a 3D stereoscopic image, the 3D stereoscopic imaging method may be divided into a top-down method in which left and right images are disposed up and down in a frame, an L-to-R (left-to-right, side by side) method in which left and right images are disposed left and right in a frame, a checker board method in which fragments of left and right images are disposed in a tile form, an interlaced method in which left and right images are alternately disposed by columns and rows, and a time sequential (or frame by frame) method in which left and right images are alternately displayed by time.

Also, as for a 3D thumbnail image, a left image thumbnail and a right image thumbnail are generated from a left image and a right image of the original image frame, respectively, and then combined to generate a single 3D thumbnail image. In general, thumbnail refers to a reduced image or a reduced still image. The thusly generated left image thumbnail and the right image thumbnail are displayed with a horizontal distance difference therebetween by a depth corresponding to the disparity between the left image and the right image on the screen, providing a stereoscopic space sense.

As illustrated, a left image and a right image required for implementing a 3D stereoscopic image may be displayed on the stereoscopic display unit 152 by a stereoscopic processing unit (not shown). The stereoscopic processing unit may receive the 3D image and extract the left image and the right image, or may receive the 2D image and change it into a left image and a right image.

If the display unit 151 and a touch sensitive sensor (referred to as a touch sensor) have a layered structure therebetween, the structure may be referred to as a touch screen. The display unit 151 may be used as an input device rather than an output device. The touch sensor may be implemented as a touch film, a touch sheet, a touch pad, and the like.

The touch sensor may be configured to convert changes of a pressure applied to a specific part of the display unit 151, or capacitance occurring from a specific part of the display unit 151, into electric input signals. Also, the touch sensor may be configured to sense not only a touched position and a touched area, but also a touch pressure. Here, a touch object is an object to apply a touch input onto the touch sensor. Examples of the touch object may include a finger, a touch pen, a stylus pen, a pointer or the like.

When touch inputs are sensed by the touch sensors, corresponding signals are transmitted to a touch controller (not shown). The touch controller processes the received signals, and then transmits corresponding data to the controller 180. Accordingly, the controller 180 may sense which region of the display unit 151 has been touched.

Referring to FIG. 1, a proximity sensor 141 may be arranged at an inner region of the mobile terminal blocked by the touch screen, or near the touch screen. The proximity sensor 141 indicates a sensor to sense presence or absence of an object approaching to a surface to be sensed, or an object disposed near a surface to be sensed, by using an electromagnetic field or infrared rays without a mechanical contact. The proximity sensor 141 has a longer lifespan and a more enhanced utility than a contact sensor.

The proximity sensor 141 may include a transmissive type photoelectric sensor, a direct reflective type photoelectric sensor, a mirror reflective type photoelectric sensor, a high-frequency oscillation proximity sensor, capacitance type proximity sensor, a magnetic type proximity sensor, an infrared rays proximity sensor, and so on. When the touch screen is implemented as capacitance type, proximity of a pointer to the touch screen is sensed by changes of an electromagnetic field. In this case, the touch screen (touch sensor) may be categorized into the proximity sensor.

Hereinafter, for the sake of brief explanation, a status that the pointer is positioned to be proximate onto the touch screen without contact will be referred to as 'proximity touch', whereas a status that the pointer substantially comes in contact with the touch screen will be referred to as 'contact touch'. For the position corresponding to the proximity touch of the pointer on the touch screen, such position corresponds to a position where the pointer faces perpendicular to the touch screen upon the proximity touch of the pointer.

The proximity sensor 141 senses proximity touch, and proximity touch patterns (e.g., distance, direction, speed, time, position, moving status, etc.). Information relating to the sensed proximity touch and the sensed proximity touch patterns may be output onto the touch screen.

When a touch sensor is overlaid on the stereoscopic display unit 152 in a layered manner (hereinafter, referred to as ' stereoscopic touch screen'), or when the stereoscopic display unit 152 and a 3D sensor sensing a touch operation are combined, the stereoscopic display unit 152 may also be used as a 3D input device.

As examples of the 3D sensor, the sensing unit 140 may include a proximity sensor 141, a stereoscopic touch sensing unit 142, an ultrasonic sensing unit 143, and a camera sensing unit 144.

The proximity sensor 141 detects the distance between a sensing object (e.g., the user's finger or a stylus pen) applying a touch by using the force of electromagnetism or infrared rays without a mechanical contact and a detect surface. By using the distance, the terminal recognizes which portion of a stereoscopic image has been touched. In particular, when the touch screen is an electrostatic touch screen, the degree of proximity of the sensing object is detected based on a change of an electric field according to proximity of the sensing object, and a touch to the 3D image is recognized by using the degree of proximity.

The stereoscopic touch sensing unit 142 is configured to detect the strength or duration of a touch applied to the touch screen. For example, the stereoscopic touch sensing unit 142 may sense touch pressure. When the pressure is strong, it may recognize the touch as a touch with respect to an object located farther away from the touch screen toward the inside of the terminal.

The ultrasonic sensing unit 143 is configured to recognize position information of the sensing object by using ultrasonic waves.

The ultrasonic sensing unit 143 may include, for example, an optical sensor and a plurality of ultrasonic sensors. The optical sensor is configured to sense light and the ultrasonic sensors may be configured to sense ultrasonic waves. Since light is much faster than ultrasonic waves, a time for which the light reaches the optical sensor is much shorter than a time for which the ultrasonic wave reaches the ultrasonic sensor. Therefore, a position of a wave generation source may be calculated by using a time difference from the time that the ultrasonic wave reaches based on the light as a reference signal.

The camera sensing unit 144 includes at least one of a camera 121, a photo sensor, and a laser sensor.

For example, the camera 121 and the laser sensor may be combined to detect a touch of the sensing object with respect to a 3D stereoscopic image. When distance information detected by a laser sensor is added to a 2D image captured by the camera, 3D information can be obtained.

In another example, a photo sensor may be laminated on the mobile terminal. The photo sensor is configured to scan a movement of the sensing object in proximity to the touch screen. In detail, the photo sensor includes photo diodes and transistors at rows and columns to scan content mounted on the photo sensor by using an electrical signal changing according to the quantity of applied light. Namely, the photo sensor calculates the coordinates of the sensing object according to variation of light to thus obtain position information of the sensing object.

The audio output module 153 may convert and output as sound audio data received from the wireless communication unit 110 or stored in the memory 160 in a call signal reception mode, a call mode, a record mode, a voice recognition mode, a broadcast reception mode, and the like. Also, the audio output module 153 may provide audible outputs related to a particular function performed by the mobile terminal 100 (e.g., a call signal reception sound, a message reception sound, etc.). The audio output module 153 may include a speaker, a buzzer or the like.

The alarm unit 154 outputs a signal for informing about an occurrence of an event of the mobile terminal 100. Events generated in the mobile terminal may include call signal reception, message reception, key signal inputs, a touch input etc. In addition to video or audio signals, the alarm unit 154 may output signals in a different manner, for example, using vibration to inform about an occurrence of an event. The video or audio signals may be also outputted via the audio output module 153, so the display unit 151 and the audio output module 153 may be classified as parts of the alarm unit 154.

A haptic module 155 generates various tactile effects the user may feel. A typical example of the tactile effects generated by the haptic module 155 is vibration. The strength and pattern of the haptic module 155 can be controlled. For example, different vibrations may be combined to be outputted or sequentially outputted.

Besides vibration, the haptic module 155 may generate various other tactile effects such as an effect by stimulation such as a pin arrangement vertically moving with respect to a contact skin, a spray force or suction force of air through a jet orifice or a suction opening, a contact on the skin, a contact of an electrode, electrostatic force, etc., an effect by reproducing the sense of cold and warmth using an element that can absorb or generate heat.

The haptic module 155 may be implemented to allow the user to feel a tactile effect through a muscle sensation such as fingers or arm of the user, as well as transferring the tactile effect through a direct contact. Two or more haptic modules 155 may be provided according to the configuration of the mobile terminal 100.

The memory 160 may store software programs used for the processing and controlling operations performed by the controller 180, or may temporarily store data (e.g., a phonebook, messages, still images, video, etc.) that are inputted or outputted. In addition, the memory 160 may store data regarding various patterns of vibrations and audio signals outputted when a touch is inputted to the touch screen.

The memory 160 may include at least one type of storage medium including a Flash memory, a hard disk, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the mobile terminal 100 may be operated in relation to a web storage device that performs the storage function of the memory 160 over the Internet.

The interface unit 170 serves as an interface with every external device connected with the mobile terminal 100. For example, the external devices may transmit data to an external device, receives and transmits power to each element of the mobile terminal 100, or transmits internal data of the mobile terminal 100 to an external device. For example, the interface unit 170 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating the authority of using the mobile terminal 100 and may include a user identity module (UIM), a subscriber identity module (SIM) a universal subscriber identity module (USIM), and the like. In addition, the device having the identification module (referred to as 'identifying device', hereinafter) may take the form of a smart card. Accordingly, the identifying device may be connected with the terminal 100 via the interface unit 170.

When the mobile terminal 100 is connected with an external cradle, the interface unit 170 may serve as a passage to allow power from the cradle to be supplied therethrough to the mobile terminal 100 or may serve as a passage to allow various command signals inputted by the user from the cradle to be transferred to the mobile terminal therethrough. Various command signals or power inputted from the cradle may operate as signals for recognizing that the mobile terminal is properly mounted on the cradle.

The controller 180 typically controls the general operations of the mobile terminal. For example, the controller 180 performs controlling and processing associated with voice calls, data communications, video calls, and the like. The controller 180 may include a multimedia module 181 for reproducing multimedia data. The multimedia module 181 may be configured within the controller 180 or may be configured to be separated from the controller 180.

The controller 180 may perform a pattern recognition processing to recognize a handwriting input or a picture drawing input performed on the touch screen as characters or images, respectively.

Also, the controller 180 may execute a lock state to restrict a user from inputting control commands for applications when a state of the mobile terminal meets a preset condition. Also, the controller 180 may control a lock screen displayed in the lock state based on a touch input sensed on the display unit 151 in the lock state of the mobile terminal.

The power supply unit 190 receives external power or internal power and supplies appropriate power required for operating respective elements and components under the control of the controller 180.

Various embodiments described herein may be implemented in a computer-readable or its similar medium using, for example, software, hardware, or any combination thereof.

For hardware implementation, the embodiments described herein may be implemented by using at least one of application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic units designed to perform the functions described herein. In some cases, such embodiments may be implemented by the controller 180 itself.

For software implementation, the embodiments such as procedures or functions described herein may be implemented by software code that may perform one or more of the functions or operations described herein.

Software codes can be implemented by a software application written in any suitable programming language. The software codes may be stored in the memory 160 and executed by the controller 180.

Figure 2:
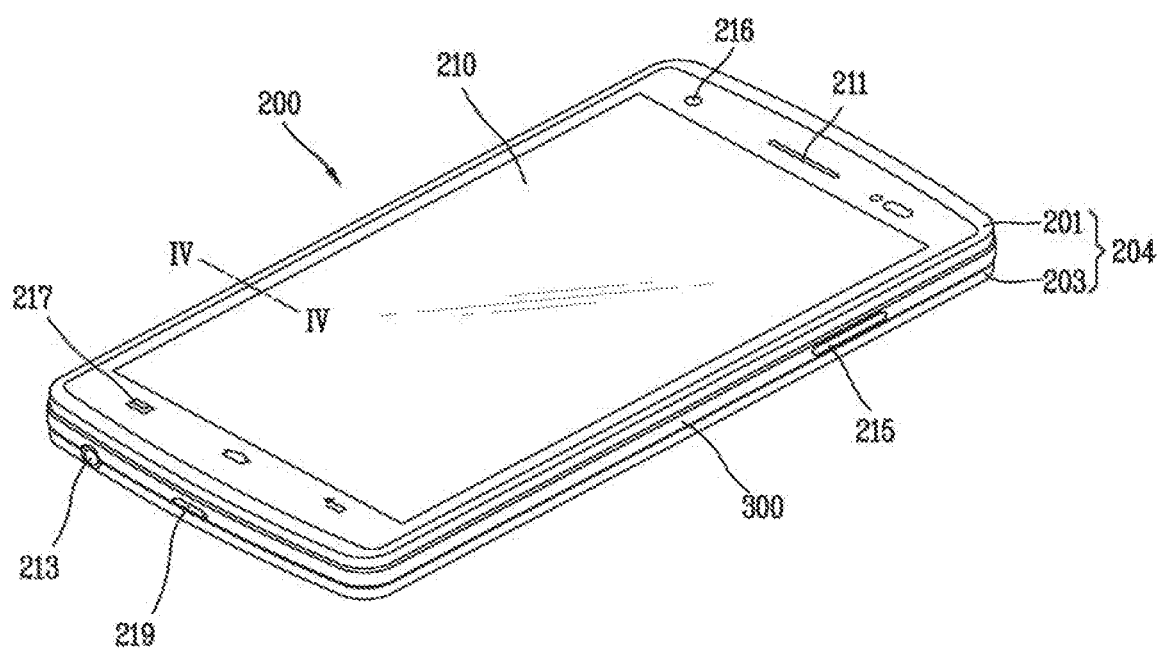
FIG. 2 is a front perspective view of a mobile terminal according to an embodiment of the present invention.
Figure 3:
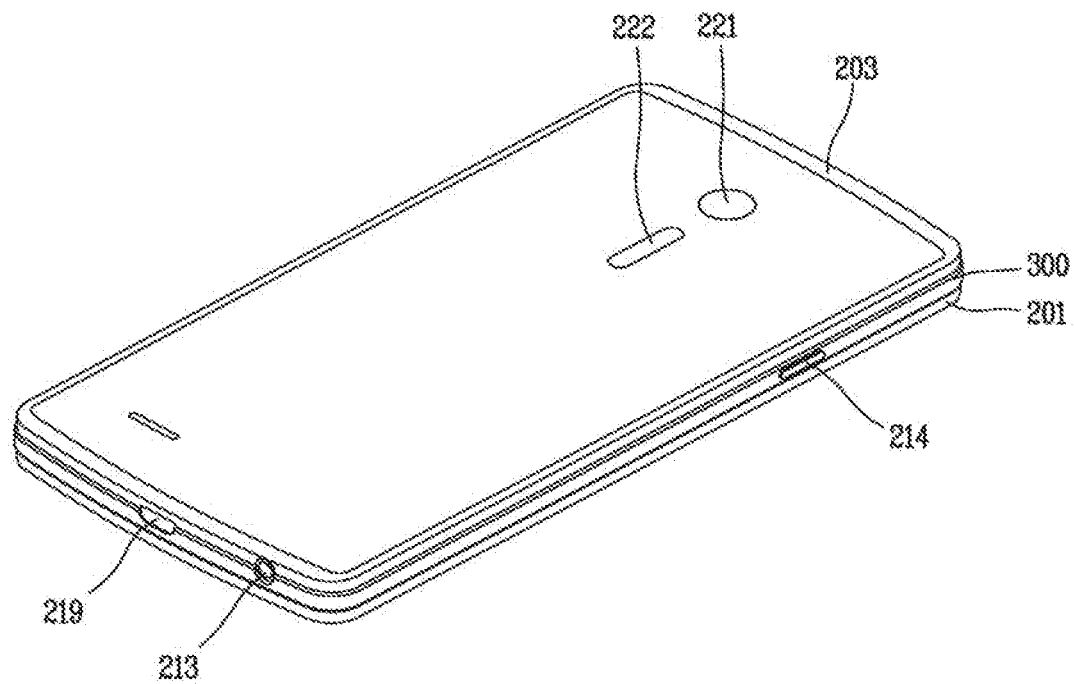
FIG. 3 is a rear perspective view of the mobile terminal of FIG. 2.

FIG. 2 is a front perspective view of a mobile terminal according to the present invention, and FIG. 3 is a rear perspective view of the mobile terminal of FIG. 2.

Referring to FIGS. 2 and 3, the mobile terminal 200 according to the present invention is provided with a bar type terminal body 204. However, the present invention is not limited to this, but may be applied to a slide type in which two or more bodies are coupled to each other so as to perform a relative motion, a folder type, a swing type, and the like. Further, the mobile terminal of the present invention may be applied to any portable electronic device having a camera and a flash, for instance, a portable phone, a smart phone, a notebook computer, a digital broadcasting terminal, Personal Digital Assistants (PDAs), Portable Multimedia Players (PMO), etc.

The mobile terminal 200 includes a terminal body 204 which forms the appearance thereof.

A housing which forms the appearance of the terminal body 204 may include a first cover 201, a second cover 202 (FIG. 4, 5), and a battery cover or third cover 203 for covering the rear surface of the second cover 202.

A space formed by the first cover 201 and the second cover 202 may accommodate various components therein. Such covers may be formed by injection-molded synthetic resin, or may be formed using a metallic material such as stainless steel (STS) or titanium (Ti).

On the front surface of the terminal body 204, may be disposed a display unit 210, a first audio output unit 211, a front camera 216, a side key 214, an interface unit 215, and a signal input unit 217.

The display unit 210 may include a liquid crystal display (LCD) module, organic light emitting diodes (OLED) module, e-paper, etc., each for visually displaying information. The display unit 210 may include a touch sensing means for inputting information in a touch manner. A display unit 210 including a touch sensing means may be called a 'touch screen' or a 'touch screen 210' herein. Once part of the touch screen 210 is touched, content corresponding to the touched position is input. The content input in a touch manner, may be characters, or numbers, or menu items which can be set in each mode. The touch sensing means may be transmissive so that the display can be viewed, and may include a structure for enhancing visibility of the touch screen at a bright place. Referring to FIG. 2, the touch screen 210 occupies most of the front surface of the first cover 201.

The first audio output unit 211 may be implemented as a receiver for transmitting a call sound to a user's ear, or a loud speaker for outputting each type of alarm sound or a playback sound of multimedia.

The front camera 216 processes image frames such as still images or moving images, acquired by an image sensor in a video call mode or a capturing mode. The processed image frames may be displayed on the display unit 210.

The image frames processed by the front camera 216 may be stored in the memory 160, or may be transmitted to the outside through the wireless communication unit 110. The front camera 216 may be implemented in two or more according to a user's interface.

The signal input unit 217 is manipulated to receive a command for controlling the operation of the mobile terminal 200, and may include a plurality of input keys. The input keys may be referred to as manipulation portions, and may include any type of ones that can be manipulated in a user's tactile manner.

For instance, the signal input unit 217 may be implemented as a dome switch, or a touch screen, or a touch pad for inputting commands or information in a user's push or touch manner. Alternatively, the signal input unit 217 may be implemented, for example, as a wheel for rotating a key, a jog, or a joystick. The signal input unit 217 is configured to input various commands such as START, END and SCROLL.

A side key 214, an interface unit 215, an audio input unit 213, etc. may be disposed on the side surface of the first cover 201.

The side key 214 may be called a 'manipulation unit', and may be configured to receive commands for controlling the operation of the mobile terminal 200. The side key 214 may include any type of ones that can be manipulated in a user's tactile manner. Content input by the side key 214 may be variously set. For instance, through the side key 214, may be input commands such as controlling the front and rear cameras 216 and 221, controlling the level of sound output from the audio output unit 211, and converting a current mode of the display unit 210 into a touch recognition mode.

The audio input unit 213 may be implemented as a microphone for receiving a user's voice, other sound, etc.

The interface unit 215 serves a path through which the mobile terminal 200 performs data exchange, etc. with an external device. For example, the interface unit 215 may be at least one of a connection terminal through which the mobile terminal 200 is connected to an ear phone by cable or radio, a port for local area communication, e.g., an infrared data association (IrDA) port, a Bluetooth® portion, a wireless LAN port, and power supply terminals for supplying power to the mobile terminal 200. The interface unit 215 may be a card socket for accommodating an external card such as a subscriber identification module (SIM) card, a user identity module (UIM) card or a memory card for storing information.

A power supply unit 240 (FIG. 4) and the rear camera 221 are disposed on the rear surface of the body 204.

A flash 222 and a mirror (not shown) may be disposed close to the rear camera 221. When capturing an object by using the rear camera 221, the flash 222 provides light onto the object.

When the user captures an image of himself/herself by using the rear camera 221, the mirror can be used for the user to look at himself/herself therein.

The rear camera 221 may face a direction which is opposite to a direction faced by the front camera 216, and may have different pixels from those of the front camera 216.

For example, the front camera 216 may operate with relatively lower pixels (lower resolution). Thus, the front camera 216 may be useful when a user can capture his face and send it to another party during a video call or the like. On the other hand, the rear camera 221 may operate with a relatively higher pixels (higher resolution) such that it can be useful for a user to obtain higher quality pictures for later use. The front camera 216 and the rear camera 221 may be installed at the terminal body 204 so as to rotate or pop-up.

The power supply unit 240 is configured to supply power to the mobile terminal 200. The power supply unit 240 may be mounted in the terminal body 204, or may be detachably mounted to the terminal body 204.

Figure 4:
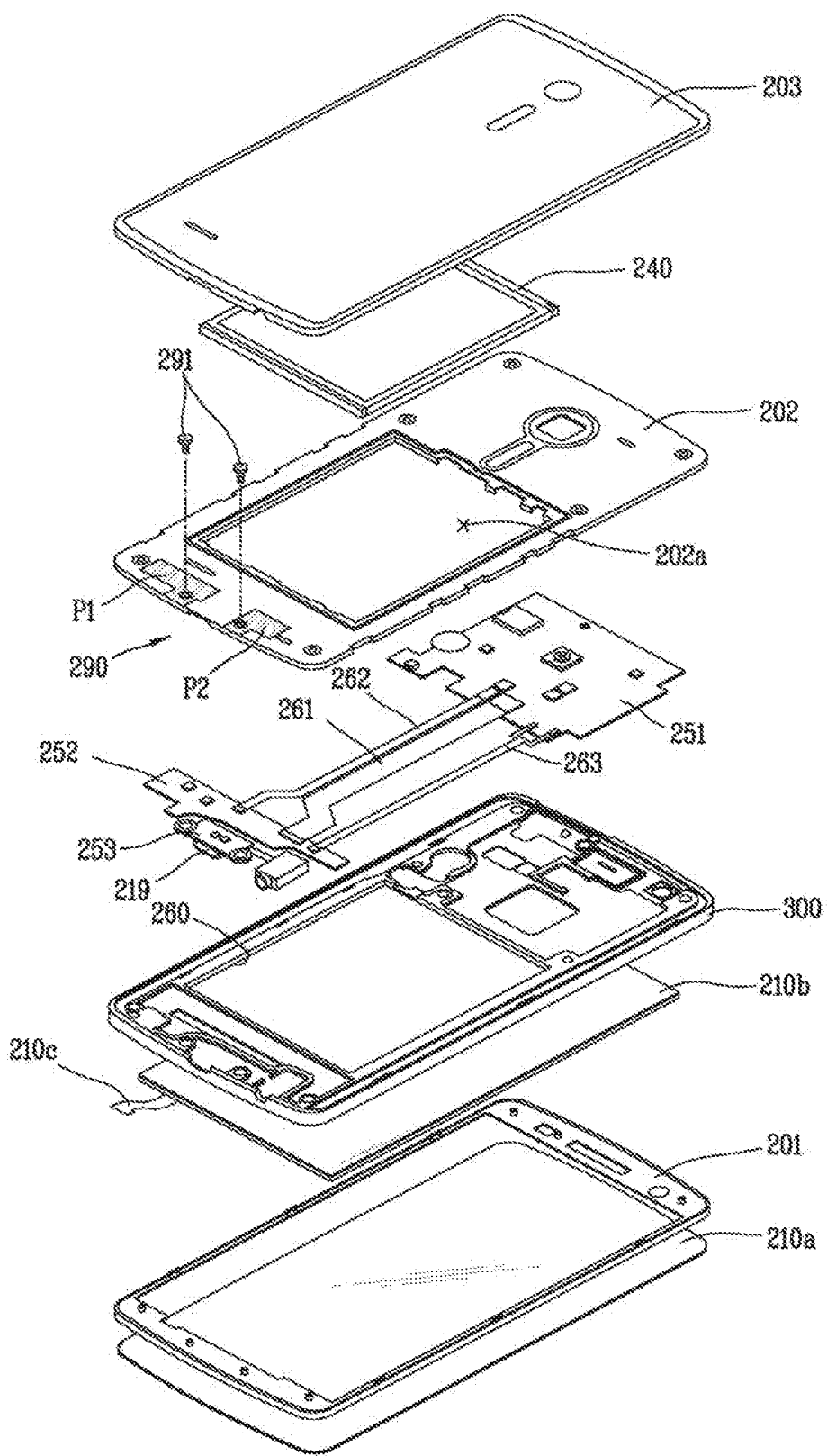
FIG. 4 is an exploded perspective view of FIG. 3.

FIG. 4 is an exploded perspective view of FIG. 3.

Referring to FIG. 4, the mobile terminal includes a window 210a and a display module 210b which constitute the display unit 210. The window 210a may be coupled to one surface of the first cover 201. The window 210a and the display module 210b may be integrally formed with each other.

A metallic frame 300, configured to support electronic devices, is formed between the first cover 201 and the second cover 202. The metallic frame 300, a structure to support inside of the mobile terminal, may be configured to support at least one of the display module 210b, the camera module 221, an antenna device, an antenna module 290 having a plurality of antenna devices, a battery 240 and a main printed circuit board 251.

The metallic frame 300 may be configured such that part thereof is exposed to outside of the mobile terminal. Further, the metallic frame 300 may constitute part of a sliding module which connects the terminal body and the display unit with each other, in a slide type mobile terminal, not a bar type mobile terminal.

Referring to FIG. 4, the main printed circuit board 251 is disposed between the metallic frame 300 and the second cover 202, and the display module 210b is coupled to one surface of the metallic frame 300. The main printed circuit board 251 and the battery 240 may be disposed on another surface of the metallic frame 300, and a battery cover or third cover 203 for covering the battery 240 may be coupled to the second cover 202.

The window 210a is coupled to one surface of the first cover 201. A touch sensing pattern, configured to sense a touch input, may be formed on one surface of the window 210a. The touch sensing pattern may be formed of a light transmissive material. The touch sensing pattern may be mounted to a front surface of the window 210a, and may be configured to convert a change of a voltage occurring from a specific part of the window 210a into an electric input signal.

The display module 210b may be mounted to a rear surface of the window 210a. In this embodiment, the display module 210b is implemented as a thin film transistor-liquid crystal display (TFT-LCD). However, the present invention is not limited to this.

For instance, the display module 210b may be implemented as a liquid crystal display (LCD), an organic light-emitting diode (OLED), a flexible display, a 3D display, etc.

As aforementioned, the main printed circuit board 251 may be mounted to one surface of the metallic frame 300. However, the printed circuit board 250 may be formed below the display module 210*b*. At least one electronic device is mounted onto a surface of the main printed circuit board 251.

A battery accommodation portion 260, which is recessed to accommodate the battery 240 therein, may be formed at the metallic frame 300. A contact terminal (not shown) connected to the main printed circuit board 251 may be located adjacent to one side surface of the battery accommodation portion 260, so that the battery 240 can supply power to the terminal body.

An antenna module may be formed on an upper end or a lower end of the mobile terminal. The antenna module may be formed in plurality in number, and the plurality of antenna modules may be disposed at the respective ends. The antenna modules may be configured to transmit and receive radio signals in different frequency bands. Such antenna module may include conductive members formed on one surface of a carrier. For instance, a carrier, where conductive members have been formed, may be mounted to a lower part of the mobile terminal. The carrier may be coupled to the second cover 202 by coupling means such as screws. In this case, the screws may be coupled to holes of the second cover 202 through holes of the carrier.

The metallic frame 300 may operate as a ground. That is, the main printed circuit board 251 or the antenna module may be ground-connected to the metallic frame 300, and the metallic frame 300 may operate as a ground of the main printed circuit board 251 or the antenna module. In such an embodiment, the metallic frame 300 may extend a ground region of the mobile terminal.

The main printed circuit board 251 is electrically connected to the antenna module, and is configured to process radio signals (or radio electromagnetic waves) transmitted and received by the antenna module. For processing of radio signals, a plurality of transceiving circuits may be mounted to the main printed circuit board 251.

The transceiving circuits may include one or more integrated circuits and related electronic devices. As an example, the transceiving circuits may include a transmission integrated circuit, a reception integrated circuit, a switching circuit, an amplifier, etc.

As the plurality of transceiving circuits simultaneously feed conductive members formed in conductive patterns, a plurality of antenna modules may operate simultaneously. For instance, while one of the transceiving circuits performs signal transmission, another may perform signal reception. Alternatively, both of the transceiving circuits may perform signal transmission or signal reception.

Coaxial cables may be formed to connect the main printed circuit board 251 with the antenna modules. For instance, the coaxial cables may be connected to feeding devices for feeding the antenna modules.

Patterns of antenna devices may be formed at one side and another side of the second cover 202. The respective antenna devices are configured to transceive (transmit and receive) signals in different frequency bands.

For instance, a first antenna device may be configured to transceive DCN 1.times. type or PCS 1.times. type signals, and a second antenna device may be configured to transceive DCN EVDO (Evolution-Data Optimized or Evolution-Data Only) type signals.

If the first antenna device transceives LTE B4 type signals, the second antenna device may transceive LTE B13 type signals.

Alternatively, if the first antenna device transceives signals corresponding to voice service of the mobile terminal, the second antenna device may transceive data signals corresponding to LTE service of the mobile terminal.

Figure 5:
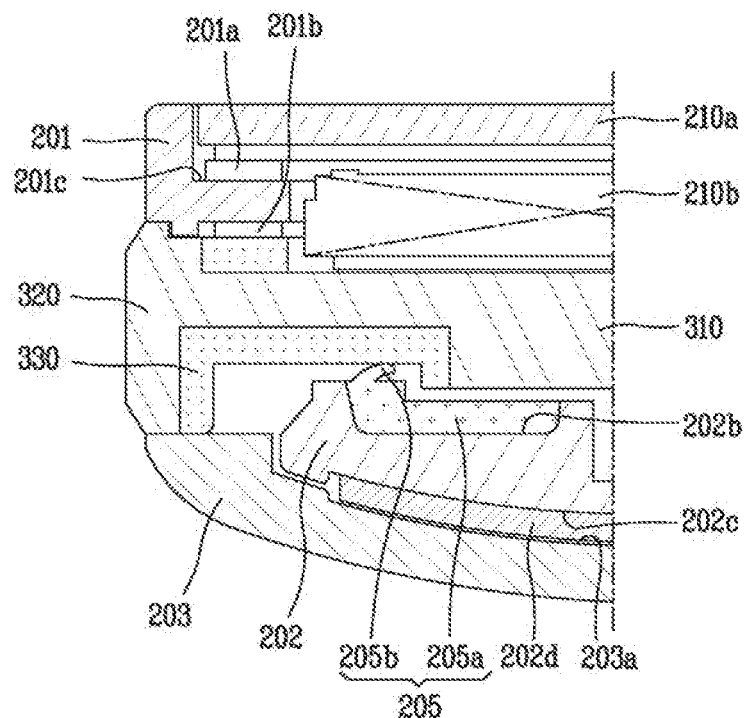
FIG. 5 is a sectional view taken along line 'IV-IV' in FIG. 2.

FIG. 5 is a sectional view taken along line 'IV-IV' in FIG. 2.

Referring to FIG. 5, the first cover 201 is coupled to a front surface of the metallic frame 300, and the second cover 202 is coupled to a rear surface of the metallic frame 300. The first cover 201 may be referred to as a front cover, and the second cover 202 may be referred to as a rear cover.

The metallic frame 300 includes a base portion 310 and an edge portion 320, and the metallic frame 300 is configured to support inside of the terminal body. The metallic frame 300 may form appearance of the terminal body as part thereof is exposed to outside.

The base portion 310 may be formed to have a plate shape, and the display unit 210 may be arranged on a front surface of the base portion 310. The display unit 210 may be supported by the base portion 310 as one surface thereof comes in contact with the base portion 310. The display unit 210 may include the display module 210*b* and the window 210*a*. The display module 210*b* and the window 210*a* may be integrally formed with each other. The display unit 210 may be coupled to the mobile terminal as the window 210*a* of the display unit 210 is mounted to the first cover 201. In such an embodiment, the first cover 201 may be provided with a window mounting portion 201*c* for mounting the window 210*a* thereto.

The edge portion 320 may be formed along an outer periphery of the base portion 310, and may be exposed to outside of the terminal body between the first cover 201 and the second cover 202. The edge portion 320 may be connected to the base portion 310, thereby emitting heat generated from inside of the mobile terminal to outside. In this case, one or more light emitting portions may come in contact with the base portion 310.

The base portion 310 and the edge portion 320 may be partitioned from each other by a non-metallic coupling 330. The non-metallic coupling 330 may be formed of a synthetic resin, etc., and may be integrally formed at the metallic frame 300 by plastic overmold.

In a case where the first cover 201 is coupled to a front surface of the metallic frame 300 and the second cover 202 is coupled to a rear surface of the metallic frame 300, waterproof layers may be formed between the covers 201, 202 and the metallic frame 300. For instance, a first waterproof layer 201*b* may be formed between the metallic frame 300 and the first cover 201, and the second waterproof layer 205 may be formed between the metallic frame 300 and the second cover 202.

The waterproof layers 201*b* and 205 may be formed between the covers 201, 202 and the non-metallic coupling 330 which covers the metallic frame 300. That is, one of the sides of the waterproof layers 201*b*, 205 may be adhered to the non-metallic coupling 330. An adhered state between components for waterproofing may be more preferably implemented on a non-metallic surface, than on a metallic surface.

The first waterproof layer 201*b* may be disposed to fill a gap between the first cover 201 and the metallic frame 300. In a case where the front side of the metallic frame 300 includes a portion that is covered by the non-metallic coupling 330, the first waterproof layer 201*b* may be formed between the non-metallic coupling 330 and the first cover 201. Two surfaces of the first waterproof layer 201*b* may be attached to the first cover 201 and the metallic frame 300, respectively. Alternatively, two surfaces of the first waterproof layer 201b may be attached to the first cover 201 and the non-metallic coupling 330, respectively. The first waterproof layer 201b may be implemented as a double-sided tape.

The second waterproof layer 205 may be coupled to the second cover 202. For this, the second cover 202 may be provided with a groove portion 202b. The groove portion 202b may be formed along an edge of the second cover 202. The second waterproof layer 205 may be provided with a first member 205a and a second member 205b, and the first member 205a may be coupled to the groove portion 202b. The second member 205b may be protruding from the first member 205a, and may be transformed toward inside of the mobile terminal when the second cover 202 is coupled to the metallic frame 300. The second member 205b may be formed of a rubber material having elasticity.

A third waterproof layer 201a may be formed between the window mounting portion 201c and the window 210a. The third waterproof layer 201a may be implemented as a double-sided tape, and two surfaces thereof may be attached to the window mounting portion 201c and the window 210a, respectively.

The second cover 202 may be provided with an opening 202a through which the battery 240 is exposed to outside. A third cover 203 may be coupled to the second cover 202 or the metallic frame 300 so as to cover the opening 202a and the second cover 202.

The metallic frame 300 may be provided for both a heat radiating function and a waterproof function. The metallic frame 300 may be connected to a conductive pattern of an antenna, so as to operate as a radiator of the antenna.

Figure 6:
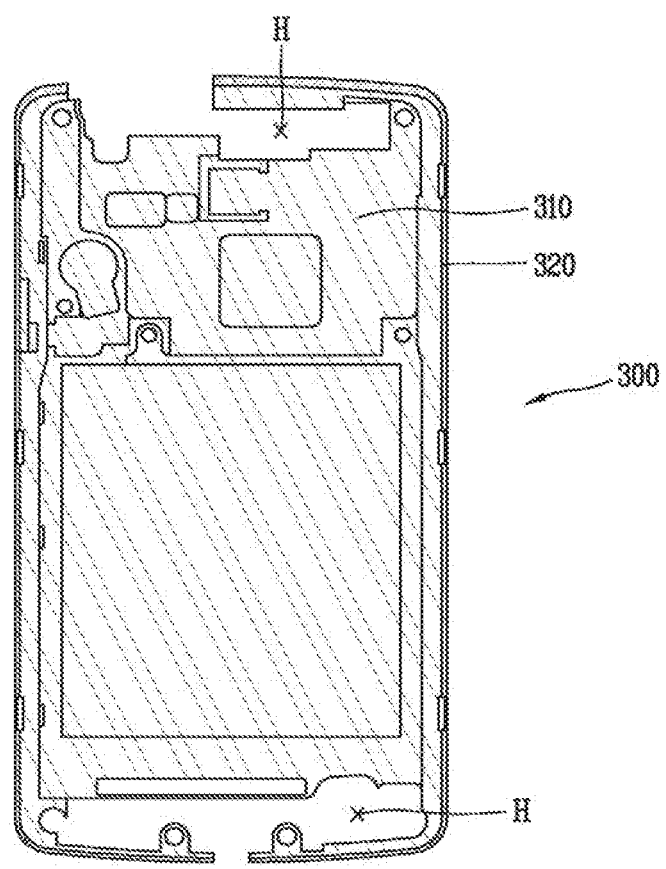
FIG. 6 is a rear view of a metallic frame according to an embodiment of the present invention.
Figure 7:
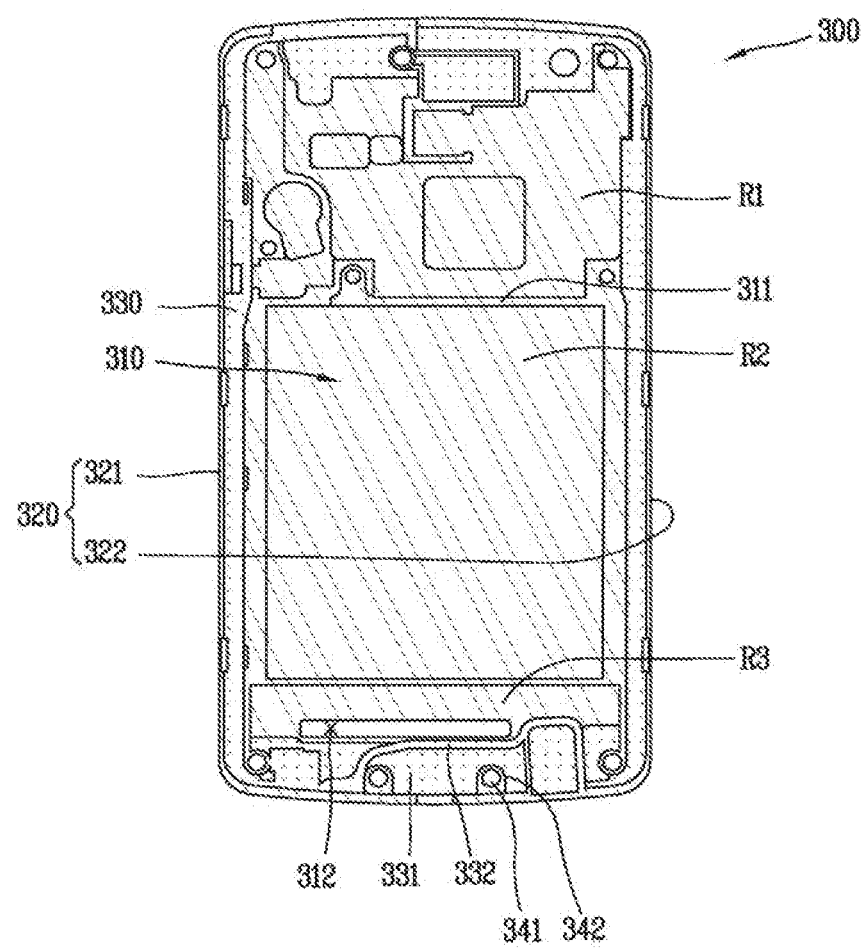
FIG. 7 is a view illustrating a state where a non-metallic coupling has been coupled to the metallic frame of FIG. 6.
Figure 8:
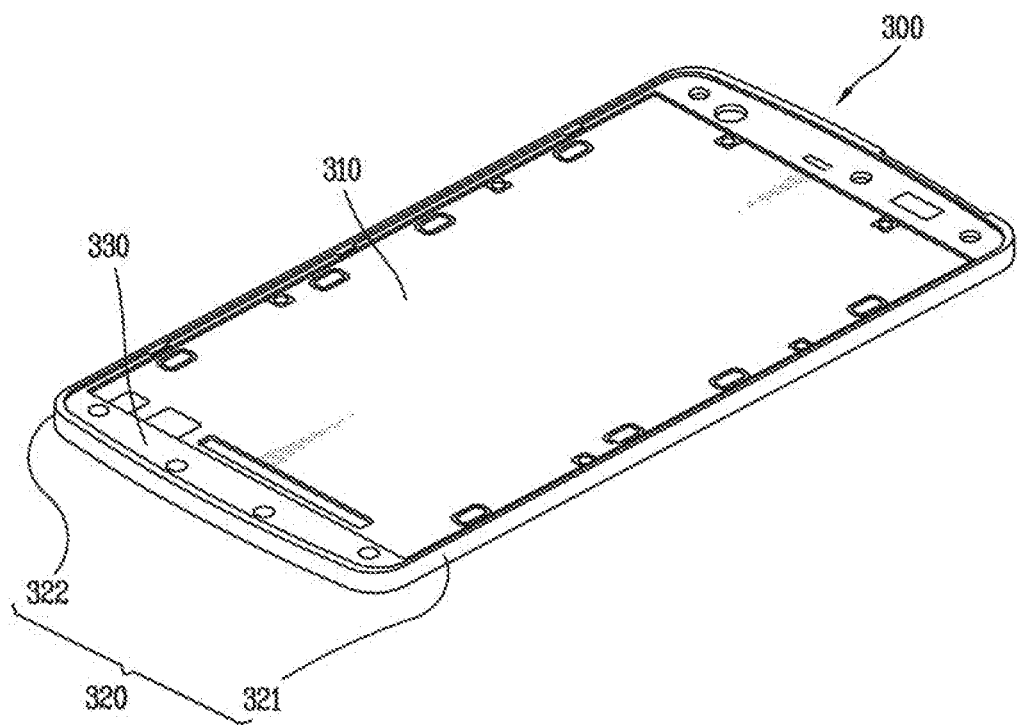
FIG. 8 is a view illustrating a front surface of the metallic frame of FIG. 7.

FIG. 6 is a rear view of the metallic frame 300 according to an embodiment of the present invention, FIG. 7 is a view illustrating a state where the non-metallic coupling 330 has been coupled to the metallic frame 300 of FIG. 6, and FIG. 8 is a view illustrating a front surface of the metallic frame 300 of FIG. 7. More specifically, FIG. 6 illustrates the metallic frame 300 in a state where the non-metallic coupling 330 has not been coupled to the metallic frame 300. FIGS. 7 and 8 illustrate a rear surface and a front surface, respectively, of the metallic frame 300 in a state where the non-metallic coupling 330 has been coupled to the metallic frame 300.

Referring to FIGS. 6 to 8, the metallic frame 300 is provided with the base portion 310 and the edge portion 320. The base portion 310 and the edge portion 320 are partitioned from each other on the front surface and the rear surface of the metallic frame 300, by the non-metallic coupling 330 coupled to the metallic frame 300.

The metallic frame 300 and the non-metallic coupling 330 may be integrally formed with each other by plastic overmold. Plastic overmold is a method for integrally forming a plastic member at a metallic member. For such plastic overmold, one or more through holes H may be formed in the metallic frame 300 to which the non-metallic coupling 330 is coupled. Once the injected non-metallic coupling 330 is hardened it covers the holes H, in this manner, the non-metallic coupling 330 may be integrally formed at the metallic frame 300.

A plurality of regions are formed on a rear surface of the metallic frame 300. The respective regions may be partitioned from each other by a rib 311 protruding from the rear surface of the metallic frame 300.

A first region (R1) is a region formed on an upper part of the rear surface of the metallic frame 300, and a main printed circuit board 251 may be arranged on the first region (R1).

A second region (R2) is a region formed on a central part of the rear surface of the metallic frame 300, and the battery 240 for supplying power to the mobile terminal may be arranged at the second region (R2). A third region (R3) may be formed below the second region (R2), and may be partitioned from the second region (R2) by the rib 311. A sub printed circuit board 252 may be arranged at the third region (R3).

A plurality of electronic devices 251a may be mounted to one surface of the main printed circuit board 251. Such electronic device may be a microprocessor for communication which operates at a high speed, or a microprocessor for non-communication. Especially, such electronic device may be a communication chip including a modem chip, an RF transmitter chip and an RF receiver chip, and/or a power supply chip including a PA (Power Amplifier) chip and a PMIC (Power Management IC) chip. While the aforementioned communication chip and/or the power supply chip operate, a large amount of heat may be generated. That is, in a mobile terminal which becomes more diversified, the amount of power used by not only the mobile terminal but also a wireless communication device is increased. Accordingly, the amount of heat generated from the wireless communication device is also increased. If heat generated from the wireless communication device is effectively emitted to outside of the mobile terminal, the entire temperature of the mobile terminal can be stably controlled. Further, heat may be also generated from the power supply chip due to an inner resistance, the power supply chip configured to supply power to the wireless communication device, to convert power, to rectify a current, to accumulate power, etc. In the mobile terminal according to an embodiment of the present invention, heat generated from the electronic devices 251a is effectively emitted to outside of the mobile terminal. This can allow the entire temperature of the mobile terminal to be stably controlled.

Such electronic device 251a may be disposed so as to be in contact with a thermal conductive member. Under such configuration, when the thermal conductive member and the metallic frame 300 contact each other, heat generated from the electronic device 251a may be transmitted to the metallic frame 300 through the thermal conductive member.

Alternatively, heat generated from the electronic device 251a may be transmitted to the metallic frame 300 in a state where the electronic device 251a and the metallic frame 300 come in contact with each other. Still alternatively, heat generated from the electronic device 251a may be transmitted to the metallic frame 300 in a state where the electronic device 251a and the metallic frame 300 do not come in contact with each other.

The edge portion 320 may include a plurality of radiation portions configured to radiate wireless signals at different frequency bands. The radiation portion may include a first radiation portion 321 and a second radiation portion 322, and may be configured such that the respective radiation portions operate at different frequency bands. The radiation portion may form a radiator together with a pattern connected to the radiation portion. Such pattern may be formed at the second cover 202. The pattern may include a first pattern (P1) connected to the first radiation portion 321, and a second pattern (P2) connected to the second radiation portion 322.

The mobile terminal may further include a through hole 341 and a conductive connection portion 342, for connection of the radiation portion of the metallic frame 300 with the pattern of the second cover 202. The through hole 341 and the conductive connection portion 342 may be formed in the non-metallic coupling 330 or the metallic frame 300. In a case where the through hole 341 and the conductive connection portion 342 are formed in the metallic frame 300, the through hole 341 and the conductive connection portion 342 correspond to part of the metallic frame 300, the part not covered by the non-metallic coupling 330.

The through hole 341 is configured to insert therein a conductive coupling 291 (FIG. 4) penetratingly-formed at the second cover 202. Once the conductive coupling 291 is inserted into the through hole 341, the radiation portion and the pattern are electrically-connected to each other. The conductive connection portion 342, a conductive pattern which extends from an inner circumference of the through hole 341 to the radiation portion, is configured to electrically-connect the through hole 341 and the radiation portion with each other.

Figure 9:
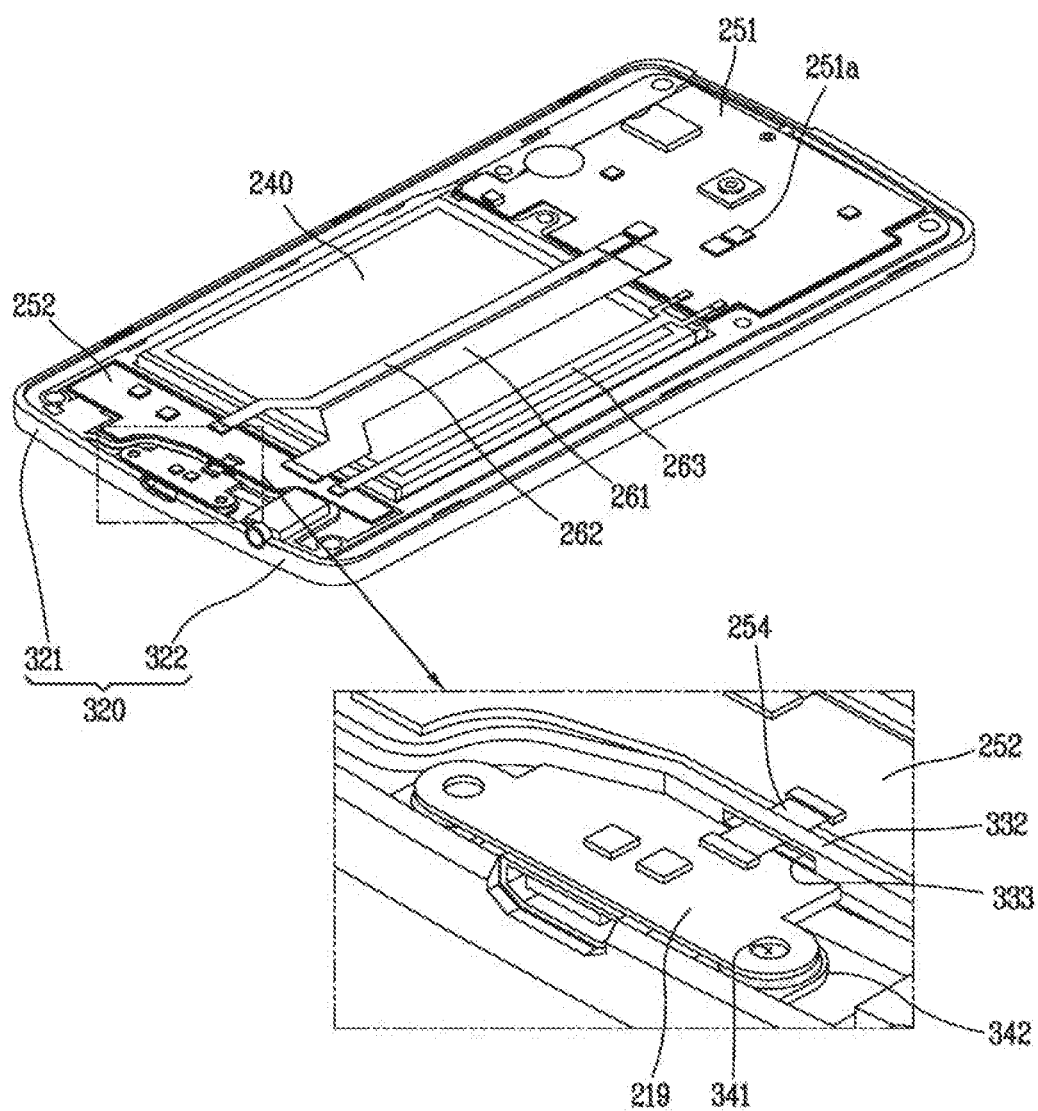
FIG. 9 is a view illustrating a state where a battery, a printed circuit board, etc. have been mounted to the metallic frame of FIG. 7 to which the non-metallic coupling has been coupled.

FIG. 9 is a view illustrating a state where the battery 240, the printed circuit boards 251, 252, etc. have been mounted to the metallic frame 300 of FIG. 7 to which the non-metallic coupling 330 has been coupled.

Referring to FIGS. 7 and 9, a rear surface of the metallic frame 300 may be divided into a first region (R1), a second region (R2) and a third region (R3).

The main printed circuit board 251 is arranged at the first region (R1), the battery 240 is arranged at the second region (R2), and the sub printed circuit board 252 is arranged at the third region (R3).

Referring to FIG. 7, the metallic frame 300 is provided with a first through portion 312. A first flexible printed circuit board 210c (refer to FIG. 4), which connects the display unit 210 and the sub printed circuit board 252 with each other, passes through the first through portion 312. The first through portion 312 may be formed at the third region (R3). The display unit 210 formed on a front surface of the metallic frame 300, and the sub printed circuit board 252 formed on a rear surface of the metallic frame 300 may be connected with each other by the first flexible printed circuit board 210c.

In this case, the sub printed circuit board 252 may be provided with one or more electronic devices for transmitting a signal to the display unit 210, or for controlling the display unit 210. Alternatively, the sub printed circuit board 252 may be provided with one or more electronic devices for processing a touch sensing signal received from the touch sensing pattern. The touch sensing pattern and the sub printed circuit board 252 may be connected with each other by the first flexible printed circuit board 210c. For this, the first flexible printed circuit board 210c may be provided with a plurality of lines. Some of the lines may connect the display unit 210 and the sub printed circuit board 252 with each other, and others of the lines may connect the touch sensing pattern and the sub printed circuit board 252 with each other.

Referring to FIG. 9, the main printed circuit board 251 and the sub printed circuit board 252 are spaced from each other in a state where the battery 240 is interposed therebetween. Second flexible printed circuit boards 261 and 262, configured to connect the main printed circuit board 251 and the sub printed circuit board 252 with each other, may be provided in order to transceive (transmit and receive) a signal by electrically-connecting the main printed circuit board 251 and the sub printed circuit board 252 with each other.

The second flexible printed circuit boards 261 and 262 may cover the battery 240 partially. The second flexible printed circuit boards 261 and 262 may extend from the main printed circuit board 251 to the sub printed circuit board 252, because the main printed circuit board 251 and the sub printed circuit board 252 are spaced from each other in a state where the battery 240 is interposed therebetween. In case of an integrated type battery not a detachable type battery, the battery 240, the main printed circuit board 251 and the sub printed circuit board 252 are mounted to a rear surface of the metallic frame 300. Then the main printed circuit board 251 and the sub printed circuit board 252 are connected with each other using the second flexible printed circuit boards 261 and 262. Such procedures are advantageous for assembly processes. The battery 240 may have an increased or decreased volume according to a usage state thereof. Accordingly, the second flexible printed circuit boards 261 and 262 are arranged to cover the battery 240. Also, the second flexible printed circuit boards 261 and 262 are formed to have a margin more than a prescribed length, so as to maintain a connection with the main printed circuit board 251 or the sub printed circuit board 252 even if the battery 240 has an increased volume.

The mobile terminal may further include a coaxial cable 263 configured to electrically-connect the main printed circuit board 251 with the sub printed circuit board 252 spaced apart from the main printed circuit board 251.

The non-metallic coupling 330 may be provided with a socket mounting portion 331 (FIG. 7) for mounting a socket 219 (FIG. 3, FIG. 4) thereto, the socket to which an external device may be electrically-connected. The socket mounting portion 331 and the third region (R3) may be partitioned from each other by a partition wall 332. The partition wall 332 is provided with a second through portion 333 for passing a third flexible printed circuit board 254 therethrough. The sub printed circuit board 252 and the socket 219 can be electrically-connected to each other through the third flexible printed circuit board 254 which passes through the second through portion 333.

Once the second cover 202 is coupled to the metallic frame 300, the second member 205b of the second waterproof layer 205 may be adhered to the partition wall 332. In this state, the inside of the mobile terminal may have a sealed state.

Figure 10:
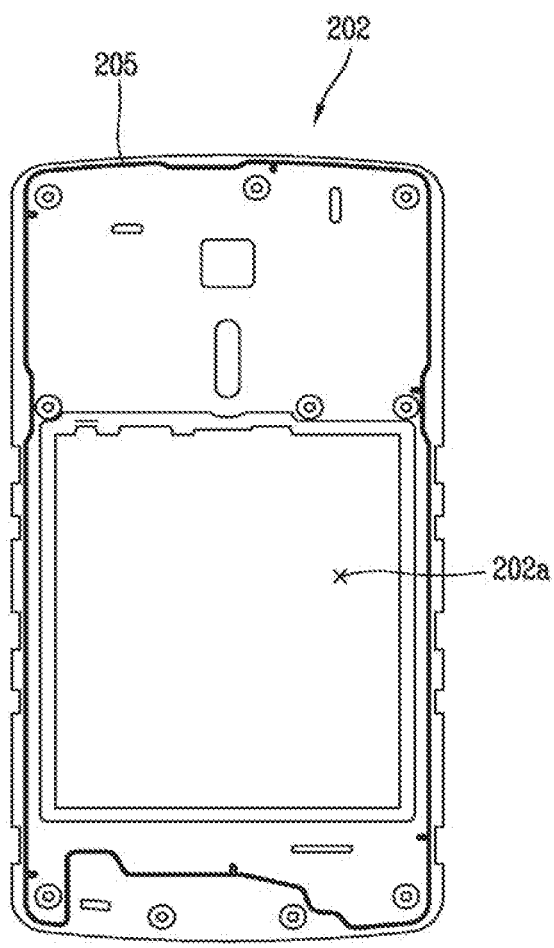
FIG. 10 is a view illustrating a front surface of a second cover according to an embodiment of the present invention.
Figure 11:
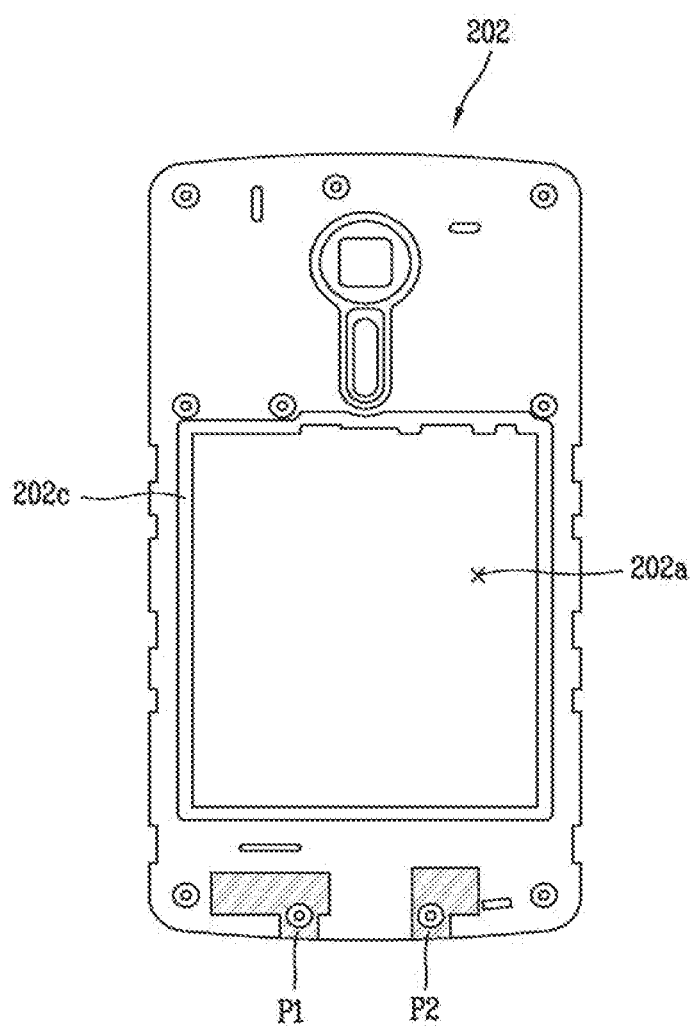
FIG. 11 is a view illustrating a rear surface of the second cover according to an embodiment of the present invention.
Figure 12:
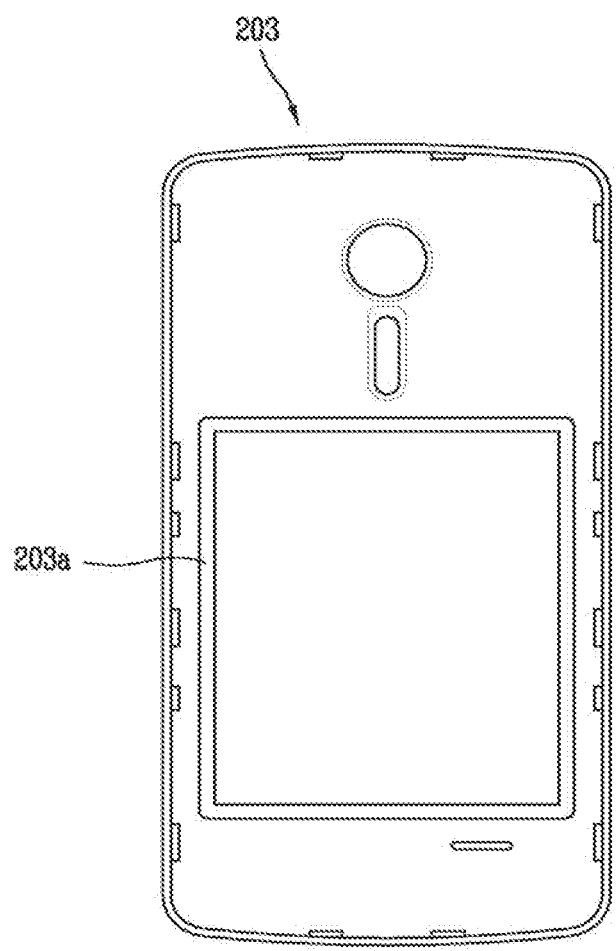
FIG. 12 is a view illustrating a rear surface of a third cover according to an embodiment of the present invention.

FIG. 10 is a view illustrating a front surface of the second cover 202 according to an embodiment of the present invention, FIG. 11 is a view illustrating a rear surface of the second cover 202 according to an embodiment of the present invention, and FIG. 12 is a view illustrating a rear surface of a third cover 203 according to an embodiment of the present invention.

Referring to FIG. 10, a second waterproof layer 205 may be formed on a front surface of the second cover 202. The second waterproof layer 205 may be coupled to the second cover 202. For this, the second cover 202 may be provided with a groove portion 202b. The groove portion 202b may be formed along an edge of the second cover 202. The second waterproof layer 205 may be provided with a first member 205a and a second member 205b, and the first member 205a may be coupled to the groove portion 202b. The second member 205b may be protruding from the first member 205a, and may be transformed toward inside of the mobile terminal when the second cover 202 is coupled to the metallic frame 300. The second member 205b may be formed of a rubber material having elasticity.

The second cover 202 may be provided with an opening 202a through which the battery 240 is exposed to outside. The battery 240 may have an increased or decreased volume according to a usage state thereof. The opening 202a may provide a space for expansion of the battery 240.

Referring to FIG. 11, the second cover 202 may be provided with a first concaved portion 202c. The first concaved portion 202c is recessed from one surface of the second cover 202 along an outer periphery of the opening 202a. As foreign substances may be introduced into the opening 202a from outside, a fourth waterproof layer 202d (refer to FIG. 5) may be formed at the first concaved portion 202c.

Referring to FIGS. 4 and 12, the third cover 203 serving as a battery cover may be coupled to the second cover 202 or the metallic frame 300. The third cover 203 may be provided with a second concaved portion 203a recessed from one surface thereof in correspondence to the first concaved portion 202c. The fourth waterproof layer 202d may be formed between the first concaved portion 202c and the second concaved portion 203a. Two surfaces of the fourth waterproof layer 202d may be attached to the first concaved portion 202c and the second concaved portion 203a, respectively. Under such configuration, foreign substances can be prevented from being introduced into a gap between the third cover 203 and the second cover 202, and inside of the mobile terminal can maintain a sealed state.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A mobile terminal, comprising:
   a wireless communication unit including one or more components which permit wireless communications between the mobile terminal and a wireless communication system;
   a plurality of antennas configured to transmit or receive radio signals;
   a metallic frame having a front side and a rear side, the metallic frame comprising:
     a base portion,
     an edge portion forming an appearance of the mobile terminal, and
     a through hole disposed in a lower portion of the metallic frame;
   a non-metallic coupling disposed in the through hole of the metallic frame;
   a window disposed on the front side of the metallic frame;
   a display module disposed between the window and the front side of the metallic frame;
   a first waterproof layer disposed between the window and the front side of the metallic frame;
   a cover disposed on the rear side of the metallic frame;
   a first printed circuit board (PCB) disposed at an upper portion of the rear side of the metallic frame, wherein the wireless communication unit is mounted on the first PCB;
   a second printed circuit board (PCB) disposed at a lower portion of the rear side of the metallic frame;
   a second waterproof layer disposed between the cover and the rear side of the metallic frame; and
   a thermal conductive member disposed between the wireless communication unit and the rear side of the metallic frame, the thermal conductive member being configured to transmit heat from the wireless communication unit to the metallic frame,
   wherein a bottom portion of the edge portion of the metallic frame is configured to operate as a radiator of at least one of the plurality of antennas,
   wherein the bottom portion of the edge portion of the metallic frame includes a first radiator separated from a second radiator by the non-metallic coupling,
   wherein the second PCB is electrically connected to the first PCB,
   wherein the second PCB is electrically connected to at least one of the first radiator or the second radiator, and
   wherein the first radiator is configured to operate in a different frequency band than the second radiator.

2. The mobile terminal of claim 1, wherein the metallic frame further comprises a first rib disposed at the rear side of the metallic frame,
   wherein the first rib divides a first region from a second region at the rear side of the metallic frame,
   wherein the first PCB is disposed in the first region at the upper portion of the rear side of the metallic frame, and
   wherein a battery is disposed in the second region at a middle portion of the rear side of the metallic frame.

3. The mobile terminal of claim 2, wherein the metallic frame further comprises a second rib disposed at the rear side of the metallic frame,
   wherein the second rib divides a third region from the second region at the rear side of the metallic frame, and
   wherein the battery is disposed in a space between the first PCB and the second PCB disposed in the third region.

4. The mobile terminal of claim 3, wherein the first PCB is electrically connected to the second PCB by a connecting flexible PCB, and
   wherein the battery is partially covered by the connecting flexible PCB.

5. The mobile terminal of claim 1, wherein the metallic frame further comprises a first through portion for passing a display printed circuit board through the first through portion.

6. The mobile terminal of claim 5, wherein the display printed circuit board is configured to electrically connect the display module with the first PCB.

7. The mobile terminal of claim 1, wherein the first radiator and the second radiator are configured to operate simultaneously in different frequency bands.

8. The mobile terminal of claim 1, wherein the first radiator and the second radiator both operate in LTE frequency bands, and the first radiator operates in a different LTE frequency band than the second radiator.

9. A mobile terminal, comprising:
   a wireless communication unit including one or more components which permit wireless communications between the mobile terminal and a wireless communication system;
   a plurality of antennas configured to transmit or receive radio signals;

a metallic frame having a front side and a rear side, the metallic frame comprising:
a base portion,
an edge portion forming an appearance of the mobile terminal,
an upper through hole disposed in an upper portion of the metallic frame, and
a lower through hole disposed in a lower portion of the metallic frame;
an upper non-metallic coupling disposed in the upper through hole of the metallic frame;
a lower non-metallic coupling disposed in the lower through hole of the metallic frame;
a window disposed on the front side of the metallic frame;
a display module disposed between the window and the front side of the metallic frame;
a first waterproof layer disposed between the window and the front side of the metallic frame;
a cover disposed on the rear side of the metallic frame;
a first printed circuit board (PCB) disposed at an upper portion of the rear side of the metallic frame, wherein the wireless communication unit is mounted on the first PCB;
a battery disposed at the rear side of the metallic frame;
a second printed circuit board (PCB) disposed at a lower portion of the rear side of the metallic frame;
a second waterproof layer disposed between the cover and the rear side of the metallic frame; and
a thermal conductive member disposed between the wireless communication unit and the rear side of the metallic frame, the thermal conductive member being configured to transmit heat from the wireless communication unit to the metallic frame,
wherein a portion of the metallic frame is configured to operate as ground,
wherein a bottom portion of the edge portion of the metallic frame is configured to operate as a radiator of at least one of the plurality of antennas,
wherein the bottom portion of the edge portion of the metallic frame includes a first radiator separated from a second radiator by the lower non-metallic coupling,
wherein the second PCB is electrically connected to the first PCB,
wherein the second PCB is electrically connected to at least one of the first radiator or the second radiator, and
wherein the first radiator is configured to operate in a different frequency band than the second radiator.

10. The mobile terminal of claim 9, wherein the metallic frame further comprises a first rib and a second rib disposed at the rear side of the metallic frame,
wherein the first rib divides a first region where the first PCB is mounted from a second region where the battery is mounted,
wherein the second rib divides a third region where the second PCB is mounted from the second region where the battery is mounted, and
wherein the battery is disposed between the first PCB and second PCB.

11. The mobile terminal of claim 10, wherein the first PCB is electrically connected to the second PCB by a connecting flexible PCB, and
wherein the battery is partially covered by the connecting flexible PCB.

12. The mobile terminal of claim 9, wherein the first radiator and the second radiator are configured to operate simultaneously in different frequency bands.

13. The mobile terminal of claim 9, wherein the first radiator and the second radiator both operate in LTE frequency bands, and the first radiator operates in a different LTE frequency band than the second radiator.

14. A mobile terminal, comprising:
a wireless communication unit including one or more components which permit wireless communications between the mobile terminal and a wireless communication system;
a plurality of antennas configured to transmit or receive radio signals;
a metallic frame having a front side and a rear side, the metallic frame comprising:
a base portion,
an edge portion forming an appearance of the mobile terminal,
an upper through hole disposed in an upper portion of the metallic frame, and
a lower through hole disposed in a lower portion of the metallic frame;
an upper non-metallic coupling disposed in the upper through hole of the metallic frame;
a lower non-metallic coupling disposed in the lower through hole of the metallic frame;
a window disposed on the front side of the metallic frame;
a display module disposed between the window and the front side of the metallic frame;
a first thermal conductive member provided between the display module and the front side of the metallic frame, the first thermal conductive member being configured to transmit heat from the display module to the metallic frame;
a first waterproof layer disposed between the window and the front side of the metallic frame;
a cover disposed on the rear side of the metallic frame;
a first printed circuit board (PCB) disposed at an upper portion of the rear side of the metallic frame, wherein the wireless communication unit is mounted on the first PCB;
a battery disposed at the rear side of the metallic frame;
a second printed circuit board (PCB) disposed at a lower portion of the rear side of the metallic frame;
a second waterproof layer disposed between the cover and the rear side of the metallic frame; and
a second thermal conductive member disposed between the wireless communication unit and the rear side of the metallic frame, the second thermal conductive member being configured to transmit heat from the wireless communication unit to the metallic frame,
wherein a portion of the metallic frame is configured to operate as ground,
wherein a bottom portion of the edge portion of the metallic frame is configured to operate as a radiator of at least one of the plurality of antennas,
wherein the bottom portion of the top edge portion of the metallic metal frame includes a first radiator separated from a second radiator by the lower non-metallic coupling,
wherein the second PCB is electrically connected to the first PCB,
wherein the second is electrically connected to at least one of the first radiator or the second radiator, and
wherein the first radiator is configured to operate in a different frequency band than the second radiator.

15. The mobile terminal of claim 14, wherein the first PCB is electrically connected to the second PCB by a connecting flexible PCB, and wherein the battery is partially covered by the connecting flexible PCB.

16. The mobile terminal of claim 14, wherein the first radiator and the second radiator are configured to operate simultaneously in different frequency bands.

17. The mobile terminal of claim 14, wherein the first radiator and the second radiator both operate in LTE frequency bands, and the first radiator operates in a different LTE frequency band than the second radiator.

18. The mobile terminal of claim 14, wherein the first radiator and the second radiator are configured to operate simultaneously, and
  wherein both of the first radiator and the second radiator operate in a signal reception function.

19. A mobile terminal, comprising:
  a wireless communication unit including one or more components which permit wireless communications between the mobile terminal and a wireless communication system;
  a plurality of antennas configured to transmit or receive radio signals;
  a metallic frame having a front side and a rear side, the metallic frame comprising:
    a base portion,
    an edge portion forming an appearance of the mobile terminal,
    an upper through hole disposed in an upper portion of the metallic frame, and
    a lower through hole disposed in a lower portion of the metallic frame;
  an upper non-metallic coupling disposed in the upper hole of the metallic frame;
  a lower non-metallic coupling disposed in the lower through hole of the metallic frame;
  a window disposed on the front side of the metallic frame;
  a display module disposed between the window and the front side of the metallic frame;
  a first thermal conductive member provided between the display module and the front side of the metallic frame, the first thermal conductive member being configured to transmit heat from the display module to the metallic frame;
  a first waterproof layer disposed between the window and the front side of the metallic frame;
  a cover disposed on the rear side of the metallic frame;
  a first printed circuit board (PCB) disposed at an upper portion of the rear side of the metallic frame, wherein the wireless communication unit is mounted on the first PCB;
  a battery disposed at the rear side of the metallic frame;
  a second printed circuit board (PCB) disposed at a lower portion of the rear side of the metallic frame;
  a second waterproof layer disposed between the cover and the rear side of the metallic frame, and
  a second thermal conductive member disposed between the wireless communication unit and the rear side of the metallic frame, the second thermal conductive member being configured to transmit heat from the wireless communication unit to the metallic frame,
  wherein a portion of the metallic frame is configured to operate as ground,
  wherein a bottom portion of the edge portion of the metallic frame is configured to operate as a radiator of at least one of the plurality of antennas,
  wherein the bottom portion of the edge portion of the metallic frame includes a first radiator separated from a second radiator by the lower non-metallic coupling,
  wherein the metallic frame comprises a first region, a second region and a third region at the rear side of the metallic frame,
  wherein the first PCB is disposed in the first region,
  wherein the second PCB is disposed in the third region,
  wherein the battery is disposed in the second region between the first region and the second region,
  wherein the first PCB and second PCB are electrically connected by a connecting flexible printed circuit board (PCB),
  wherein the second PCB is electrically connected to at least one of the first radiator or the second radiator, and
  wherein the first radiator is configured to operate in a different frequency band than the second radiator.

20. The mobile terminal of claim 19, wherein the first radiator and the second radiator are configured to operate simultaneously in different frequency bands.

21. The mobile terminal of claim 19, wherein the first radiator and the second radiator both operate in LTE frequency bands, and the first radiator operates in a different LTE frequency band than the second radiator.

22. The mobile terminal of claim 19, wherein the first radiator and the second radiator are configured to operate simultaneously, and
  wherein both of the first radiator and the second radiator operate in a signal reception function.

23. The mobile terminal of claim 19, wherein the metallic frame further comprises a first rib and a second rib disposed at the rear side of the metallic frame,
  wherein the first region and the second region are divided by the first rib, and
  wherein the second region and the third region are divided by the second rib.

* * * * *